United States Patent [19]
Lam

[11] Patent Number: 5,594,443
[45] Date of Patent: Jan. 14, 1997

[54] D/A CONVERTER NOISE REDUCTION SYSTEM

[76] Inventor: Peter A. Lam, 20104 Wayne Ave., Torrance, Calif. 90503

[21] Appl. No.: 234,281

[22] Filed: Apr. 28, 1994

[51] Int. Cl.$^6$ .................................................. H03M 1/66
[52] U.S. Cl. ........................................................ 341/144
[58] Field of Search ...................................... 341/144, 120, 341/123, 122, 61

[56] References Cited

U.S. PATENT DOCUMENTS 4,620,158 10/1986 Yasukawa ................................. 329/50
4,768,108 8/1988 Higurashi ................................. 360/19.1

*Primary Examiner*—Brian K. Young
*Attorney, Agent, or Firm*—Freilich, Hornbaker, Rosen

[57] ABSTRACT

An apparatus for improving the quality of an analog signal reproduced from digital samples by limiting the amount of sampling and quantization noise present within reproduced analog signals. The apparatus is comprised of a D/A converter coupled to an interpolator processing original digital samples operating at a reproduction rate greater than the original sampling frequency and at a digital resolution greater than or equal to the original digital samples to generate digital pseudo-samples. The processed digital pseudo-samples are then provided to the D/A converter at the reproduction rate. As a consequence of the increase in the reproduction rate, sampling noise is moved further away in the frequency domain from the original analog signal, thus eliminating or reducing the requirement for a low-pass filter. Due to the increased number of samples and the increased digital resolution of the samples, the reproduction errors are further minimized.

51 Claims, 11 Drawing Sheets

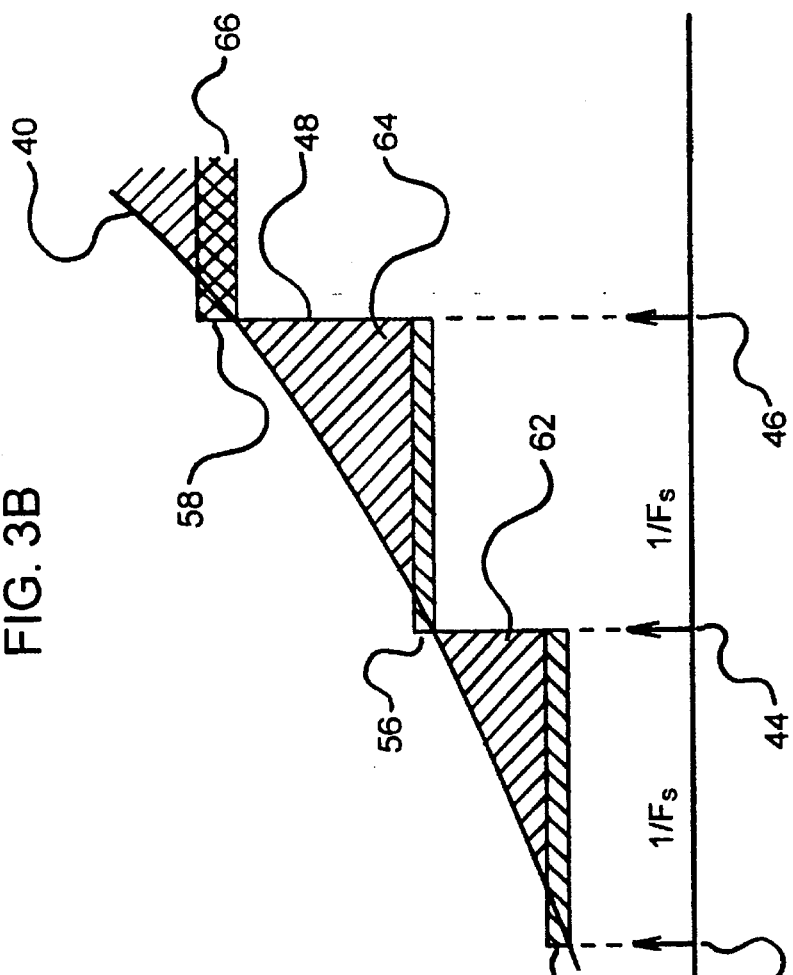
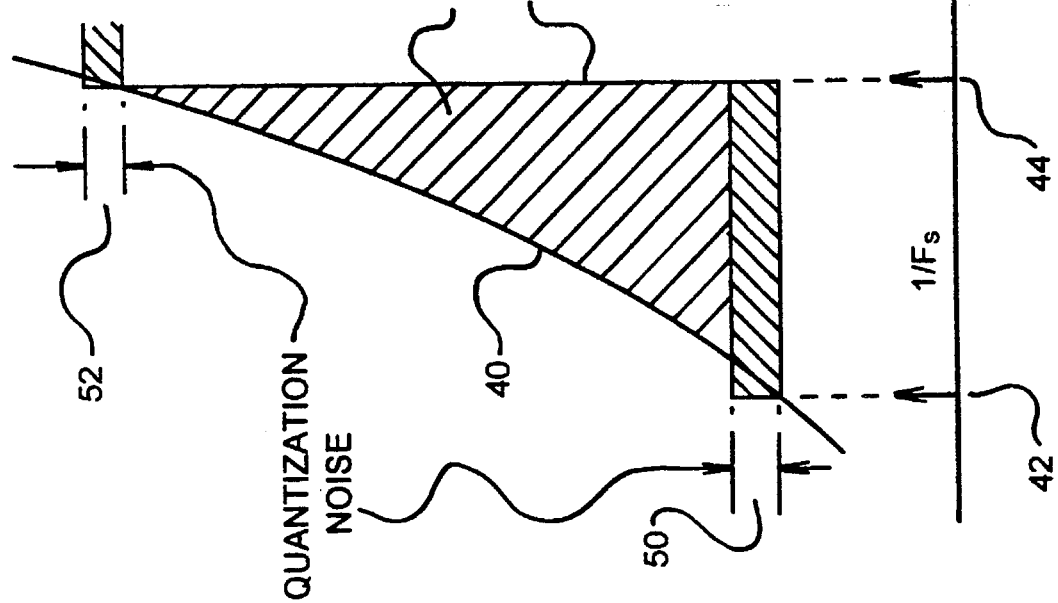

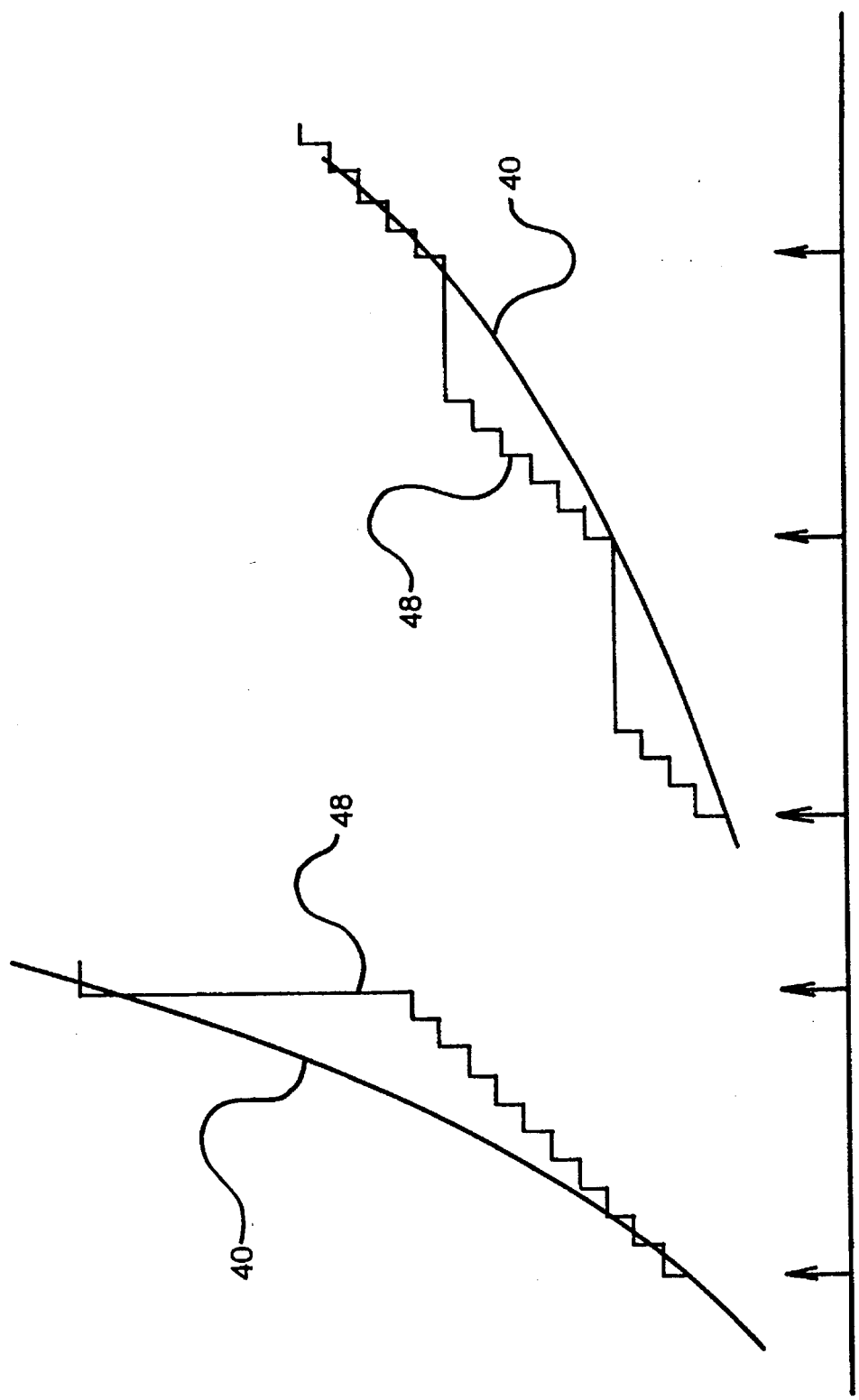

5,594,443

D/A CONVERTER NOISE REDUCTION SYSTEM

BACKGROUND OF THE INVENTION

The present invention relates generally to D/A (digital to analog) converter systems useful for reproducing analog signals from digital data and more particularly to improvements in such systems for minimizing noise attributable to sampling and quantization errors. Thus, these improvements eliminate or reduce the need for a low-pass filter to reduce the sampling noise.

It is common practice to digitally sample an analog signal, e.g., representative of speech, sound synthesis, or video, to generate digital data samples that can later be used to reproduce a copy of the original analog signal. Digital sampling is desirable since digital signals can be reproduced with essentially no errors, thus providing improved reproduction over analog techniques. This digital data can be stored using any process available to data processors, e.g., in digital memory, on a hard or floppy disk, on CD-ROM, etc.

To reproduce an analog signal via digital sampling, the sampling rate must be at least two times the bandwidth of the original analog signal. This rate is referred to as the Nyquist rate. Digital sampling introduces two types of errors. The first type of error is due to the sampling rate and generates noise at the sampling frequency and at multiple harmonics of the sampling frequency. For example, an audio signal with an original bandwidth of 4 KHZ and sampled at an 8 KHZ Nyquist rate will have sampling noise at 8 KHZ, 16 KHZ, 24 KHZ, 32 KHZ, etc., in the reproduced signal. Thus, it is desirable to low-pass filter the reproduced signal to eliminate this sampling noise. However, while an ideal low-pass filter can eliminate this sampling noise, real world low-pass filters may either partially limit the original signal or permit some of the sampling noise to survive. Alternatively, increasing the sampling frequency would simplify the task of the low-pass filter. However, the quantity of digital data would also increase significantly.

Additionally, a digital sample generally can not identically represent the original analog signal even at each sampling point due to quantization errors, the inability of a digital representation with a limited number of data bits to accurately represent the original analog signal. While increasing the number of data bits could decrease this error, such a change would also increase the digital data storage requirements and in the case of communication systems increase the required transmission bandwidth.

JP. Pat No. 1-215126 to Takeda and U.S. Pat. No. 3,754, 236 to Dotson, Jr. disclose circuitry that generate multiple delayed digital source signals, convert the delayed digital signals into analog signals with multiple D/A converters and then manipulate the converted analog signals to provide final interpolated signals. JP. Pat. 59-36422 to Katou discloses a similar concept to Takeda except it applies this concept to PWM (Pulse Width Modulation).

SUMMARY OF THE INVENTION

The present invention is directed toward improvements in reproducing an analog signal with a D/A converter by synthesizing a plurality of intermediate digital pseudo-samples at a reproduction rate greater than the original sampling frequency where the synthesized pseudo-samples have binary resolutions greater than or equal to the original digital samples.

A preferred embodiment of the invention is comprised of a data source providing sequentially occurring original N-bit digital samples (typically derived by sampling an original analog signal at a sampling frequency Fs) together with control circuitry fetching P of said original digital samples, for sequentially producing M-bit digital pseudo-samples interleaved with said original digital samples, for driving a D/A converter at a simulated increased reproduction rate Fr. This reproduction rate Fr produces sampling noise well beyond that of the spectrum of the original analog signal.

In accordance with a further aspect of the invention, the digital resolution in binary digits (bits) of the M-bit interpolated values is extended beyond that of the original N-bit digital samples to further minimize the amplitude of noise generated by digital sampling.

In accordance with still a further aspect of the invention, the interpolated digital pseudo-samples are generated by first equally dividing the difference between consecutive digital samples by K, an integer value, to generate a step value and then sequentially adding digital values equal to said step value to an accumulated value.

Embodiments in accordance with the present invention operate on sequences of digital samples that directly represent the sampled analog values or sequences of digital samples that represent the delta or difference between sequential digital samples. Furthermore, the present invention can be embodied in structures in hardware that generate the interpolated values or in computing systems that generate the interpolated values before providing said values to a D/A converter.

The novel features that are considered characteristic of this invention are set forth in the appended claims. The invention will best be understood from the following description when read in connection with the accompanying drawings.

BRIEF DESCRIPTION OF THE DRAWINGS

FIGS. 3A–3B are partial waveform diagrams showing sampling an analog signal and the effects of quantization and sampling errors;

FIGS. 5A–5B are partial waveform diagrams showing the resulting noise reduction using the embodiment of FIG. 4 with a predetermined pseudo-sampling frequency and a fixed step size;

DESCRIPTION OF THE PREFERRED EMBODIMENTS

Figure 1:
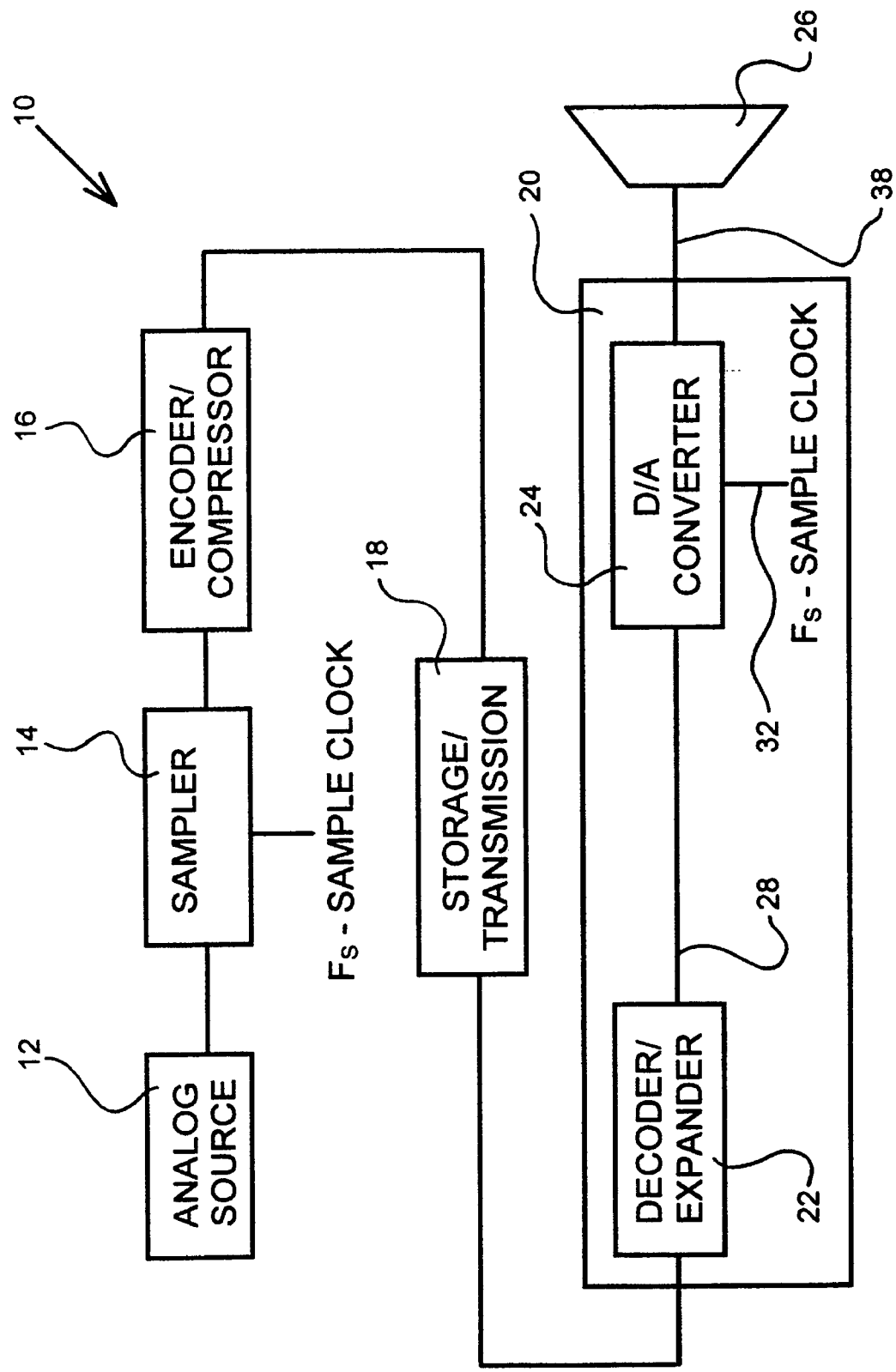
FIG. 1 is a simplified block diagram of a prior art digital sampling system.

Throughout the following detailed description, similar reference characters refer to similar elements in all figures of the drawings.

Attention is initially directed to FIG. 1 which depicts a typical digital sampling system 10 of the prior art for use with an audio signal. A signal from an original analog signal source 12 of bandwidth no greater than 0.5 Fs is sampled by a sampler 14 using a sample clock Fs at the Nyquist rate for the original analog signal. This sampling generates a series of pulse code modulated (PCM) digital samples that can be used to generate a reproduced analog signal. PCM samples are multibit digital samples that directly represent (within quantization limits) the original analog signal at each sampling point. These PCM samples are coupled to an encoder/compressor 16 that processes the PCM samples for coupling to storage/transmission circuitry 18 where the PCM samples are alternatively stored in a digital storage medium, e.g., digital memory, disk storage, etc., for subsequent reconstruction into an analog signal or transmitted to reproduction circuitry 20. The reproduction circuitry 20 using a decoder/expander 22 fetches a digital signal representing each digital sample and provides each sample to D/A converter circuitry 24 at the sampling rate Fs. The D/A converter circuitry 24 is coupled to an audio output device, e.g., a speaker 26.

In some prior art systems, the PCM data is further encoded, using the encoder/compressor 16, to minimize the amount of digital data to be stored or transmitted. The following are examples of some of the known methods:

DM (Delta Modulation), differential modulation using a single bit. A "1" data bit increments the output data by one level. A '0' data bit decrements the output data by one level.

DPCM (differential PCM), equivalent to multibit delta modulation. For example, with a 3-bit DPCM, a single sign bit indicates the polarity of the next data sample (increment or decrement) and the two remaining bits indicate the change in the magnitude.

ADPCM (Adaptive Differential PCM), similar to DPCM except that a criteria is imposed to dynamically change surrounding samples. For example, in a 3-bit ADPCM, the quantization level is doubled every time the sample data is 111 or 011 (an upward or downward full count). Likewise, the quantization level is halved when the last data is 000 (zero count). The criteria may also involve reference to the absolute level of the final data. For example, the adaptive function may only happen at the high signal levels.

Non-linear mapping, a dynamic range of the quantization is achieved by encoding the binary data samples into encoded binary samples having a reduced binary resolution. For example, with speech signal processing the quantization at a high signal level can be made much greater than the quantization at a low signal level. An expansion algorithm is required to restore the original binary data. Typically, an algorithm analyzes several neighboring data samples (data samples in front and behind) to determine the data trend and checks the level of the signal to determine the quantization level. It may also involve a table look up to expand the encoded data samples.

The above mentioned techniques are all standard coding/decoding techniques. Each of the coding techniques has a different signal/noise ratio (assuming the same sampling frequency and same bit rate), and a different compression ratio (taking standard PCM as reference).

There are also individual modified coding/decoding systems which use different kinds of non-linear quantization criteria and data compression criteria and use their own proprietary names, e.g., ASPCM (Adaptive Step PCM).

Figure 2:
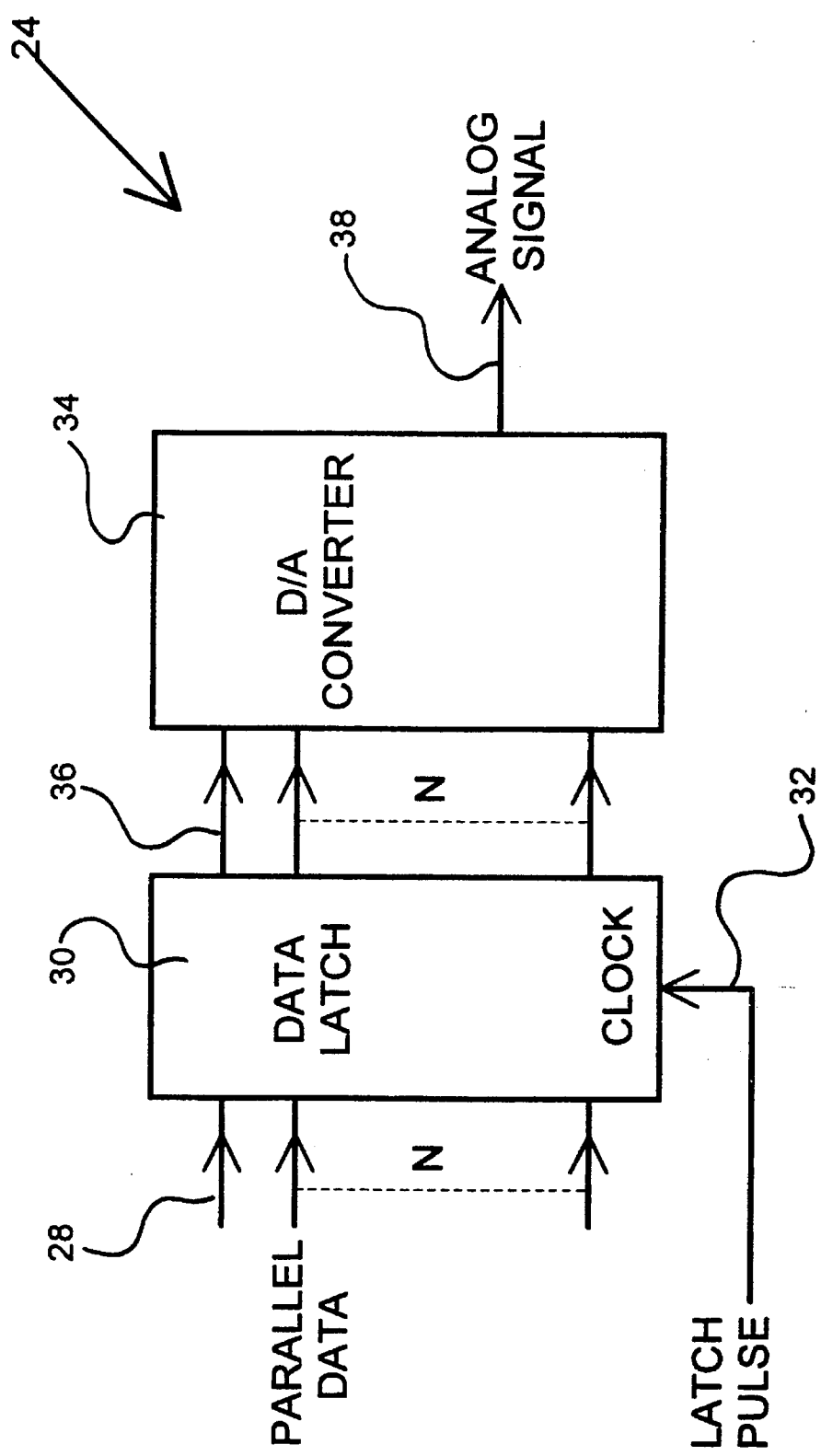
FIG. 2 is a block diagram of typical parallel D/A converter circuitry found in a prior art system.

Once, the digital data is received by the reproduction circuitry 20, it is formed into N-bit binary digital samples, i.e., PCM samples, by the decoder/expander 22. With reference now to FIG. 2, there is shown a detailed block diagram of the D/A converter circuitry 24. Digital samples are typically provided in parallel, one at a time, along an N-bit parallel data path 28 to a data latch 30. A latch pulse is provided at the rate of the sample clock on a latch signal path 32 to capture each digital sample. The data latch 30 provides each captured digital sample to a D/A converter 34 along an N-bit latched data path 36. Through means well known in the art, the D/A converter 34 generates a reproduced analog signal 38 representative of each digital sample. This process repeats at the sampling frequency Fs under control of the latch pulse and thus the digital samples are also provided at a rate of Fs.

D/A converters are classified into two types, voltage converters and current converters. Voltage converters generate an analog voltage signal that can be readily inspected with an oscilloscope. Current converters provide an analog current and are more popular in the voice synthesizer chips in the market. A current output pin is directly connected to the base of a driving transistor which in turn drives a speaker. In addition to a parallel digital converter, the D/A converter circuitry 24 can alternatively be constructed using a serial D/A converter which inputs the digital samples, a single bit at a time, into a serial D/A converter. It should be apparent to one of ordinary skill in the art that in the prior art as well as with embodiments of the present invention, the different types of D/A converters are functionally interchangeable.

With reference to FIGS. 3A–3B, the repercussions of this sampling technique are shown. In these figures, there is shown a portion of an original analog signal 40 sampled at sampling points 42, 44 and 46, separated by a time period equal to 1/Fs and generating a reproduced analog signal 48. Digital samples have a limited capability to represent the original analog signal 40 due to their binary resolution. Since even at the sampling points a digital sample cannot identically represent an analog signal, an error is generated referred to as quantization noise and denoted as shaded areas 50, 52, 54, 56 and 58. Additionally, due to the reproduced analog signal 48 being static between sampling pulses, an additional error is generated referred to as sampling noise and denoted as shaded areas 60, 62, 64 and 66.

To minimize quantization noise, the bit (binary digit) resolution of the sampling A/D and reproducing D/A converters could be increased. However, this would require the storage or transmission, in digital communication systems, of additional data bits and thus increased costs. Similarly, increasing the sampling rate can result in substantial increases in the required amount of storage or transmission bandwidth. Thus, it is desirable to reproduce a sampled analog signal without increasing the data storage requirements and still reduce the sampling and quantization noise.

Figure 4:
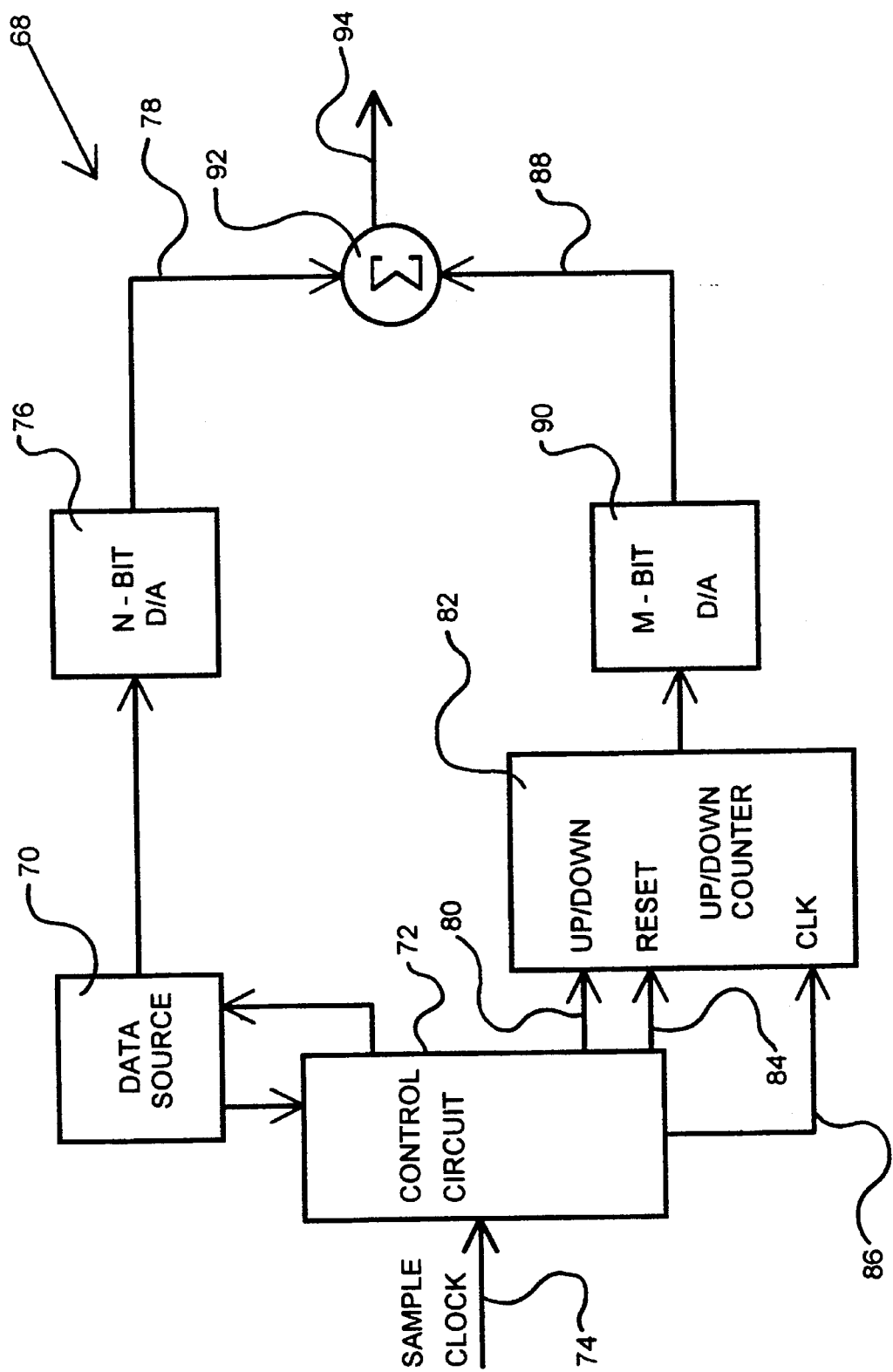
FIG. 4 is a block diagram of a preferred embodiment of the present invention showing means to provide multibit fixed step values to a second D/A converter whose output is summed with the output of a first D/A converter responsive to the digital sample values.

With reference to FIG. 4, there is shown a preferred embodiment of a D/A converter system 68 of the present invention that generates intermediate digital pseudo-samples between the original digital samples to reduce the sampling noise. This process of calculating the intermediate pseudo-samples is referred to as interpolation. By inserting digital pseudo-samples, the present invention pushes the effective sampling frequency and associated noise beyond that of an observer. For example with an audio reproduction system, resultant sampling noise can be pushed beyond the mechanical bandwidth of a speaker or a human's hearing. The upper audible frequency of the human ear depends upon the age and health of a person. The common understanding is to define the upper audible limit of a healthy normal human ear to be around 20 KHZ. Similar advantages are achieved when embodiments of the present invention are applied to other types of analog signals, e.g., video. The D/A converter system 68 contains intermediate storage within a data source 70 for a plurality of digital samples of the original analog signal. A control circuit 72 fetches, in response to each sample clock pulse on signal path 74, a digital sample from the data source 70 and provides this sample to a first D/A converter 76 which responsively generates a first analog signal 78. As described previously, the present invention applies to PCM as well as other digital encoding techniques. In embodiments that utilize other encoding techniques, the control circuit 72 will additionally decode/expand the encoded digital signal.

The control circuit 72 additionally determines the up/down trend in the reconstructed analog signal and provides an up/down signal on signal path 80 to an up/down counter 82. In the case of a PCM signal, this up/down determination is done by comparing the digital values represented by two consecutive digital samples. However, with differential methods, e.g. DPCM, the sign bit can be directly referenced to make this determination. The up/down counter 82 is used to generate intermediate digital pseudo-samples comprised of a series of fixed M-bit digital steps where the up/down signal determines the up/down slope of the steps. At the beginning of each digital sampling period, the control circuit 72 generates a reset signal on signal path 84 to the up/down counter 82. A reproduction clock is supplied on signal path 86, preferably from the control circuit 72 to the up/down counter 82. This signal causes a digital value accumulated within the M-bit up/down counter 82 to be incremented/decremented for each reproduction clock to generate a sequence of steps between the digital sample values. This accumulated value is converted into a second analog signal 88 with a second D/A converter 90 and this second analog signal 88 is summed by a summer 92 with the first analog signal 78 to generate a noise limited analog signal 94. However, since the second D/A converter only provides interpolated values, the binary resolution of the second D/A converter and the up/down counter are preferably higher than that of the first D/A converter 76; i.e., M is greater than N.

The accumulated value contained within the up/down counter 82 is not permitted to increase/decrease indefinitely. Instead, the control circuit 72 monitors the first sample value, the second sample value and the value contained within the up/down counter 82 to limit the amount of steps inserted between the first sample value and the second sample value. In one preferred embodiment, the control circuit 72 stops generating the reproduction clock on signal path 86 when the value contained within the up/down counter 82 first exceeds the difference between the two sample values. In another preferred embodiment, the reproduction clock is stopped if the next clock pulse would cause the up/down counter 82 to exceed the difference between the two sample values.

With reference now to FIGS. 5A and 5B, the repercussions of using this apparatus is shown. FIGS. 5A and 5B respectively correspond to FIGS. 3A and 3B except that intermediate pseudo-samples, having a fixed step size, are added between each pair of digital samples. By comparing, these figures it should be apparent that the sampling noise, the difference between the original analog signal 40 and the reproduced analog signal 48, is decreased by using the apparatus of FIG. 4.

Figure 6A:
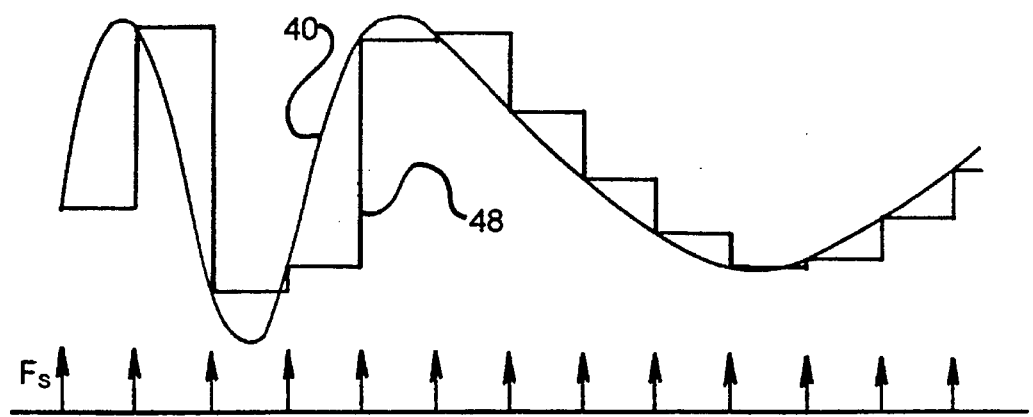
FIGS. 6A–6D show partial waveform diagrams showing the effect of fixed and adjustable step sizes on limiting the effects of digital sampling on the reproduced analog signal.
Figure 6B:
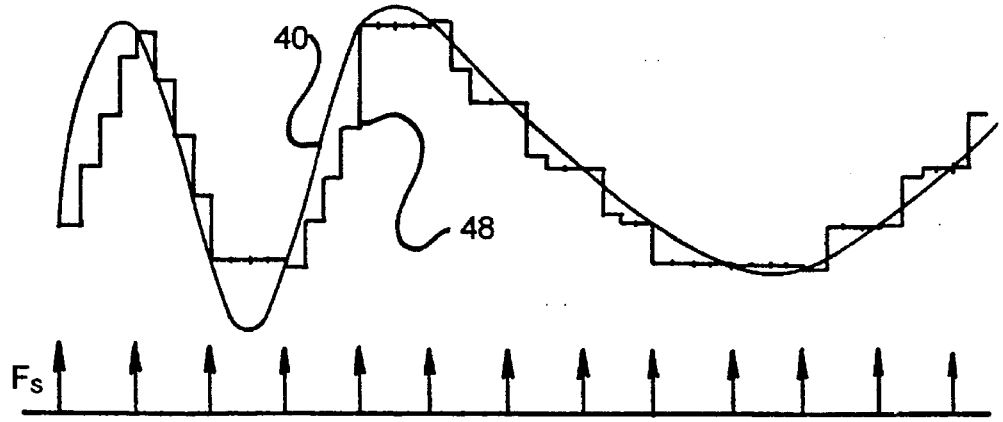
Figure 6C:
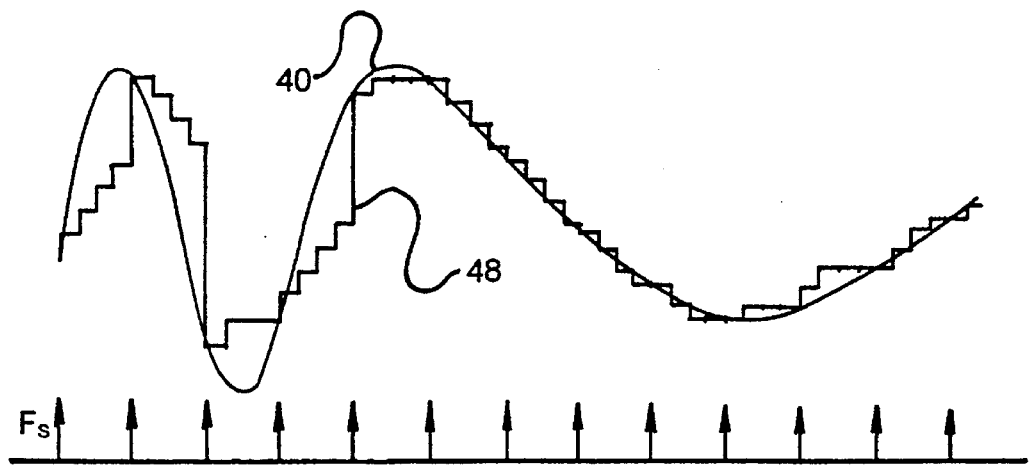

With reference now to FIGS. 6A–6C, there is shown the repercussions of the step size relative to the slope of the original analog signal in a system free from quantization errors. In FIG. 6A, there is shown the results that would be achieved with a prior art system. However, using embodiments of the present invention having a fixed step size, the results of FIG. 6B are achieved. Notably, the sampling error is decreased significantly. The effect of choosing a proper step size is shown in FIG. 6C where the step size is reduced to half of that shown in FIG. 6B. In FIG. 6C, it is shown that the reproduced analog signal 48 more closely represents the original analog signal 40 during the second half of the figure where the slope of the original analog signal 40 is more shallow. However, by comparison with FIG. 6B, it is shown that the sampling noise is lower for the first half of the original analog signal with the larger step size of FIG. 6B than is shown in FIG. 6C with a smaller step size. Thus, the choice of step size is preferably made in reference to standard characteristics of a particular original analog signal.

Figure 6D:
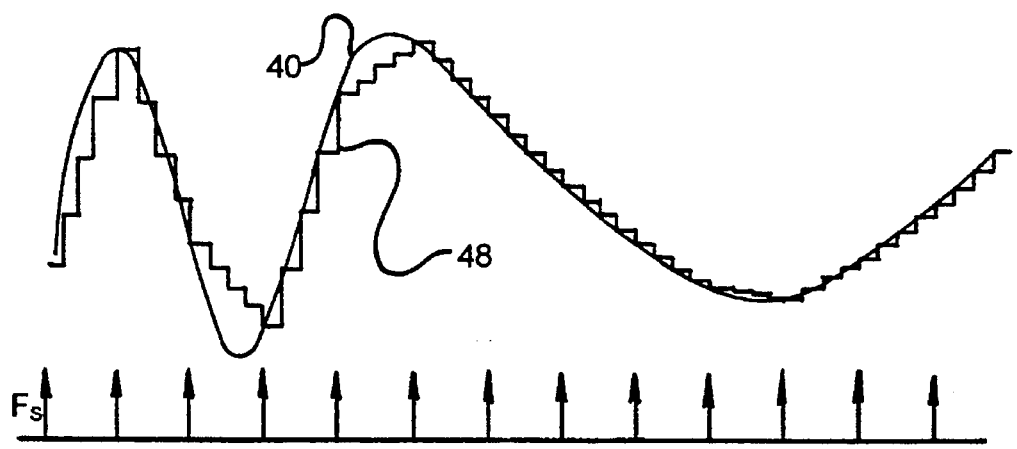

With reference to FIG. 6D, there is shown a reproduced analog signal 48 from another preferred embodiment. If, instead of using a fixed step size, an adjustable step size is used, the step size can be adapted to each pair of sequential digital samples. Thus, in FIG. 6D, the original analog signal is shown with a reproduction clock of K, an integer value, times the sample rate. A step size is preferably chosen that is equal to 1/K times the difference between consecutive digital samples (K=4 in this figure). Thus, if SO is the first digital sample and S1 is the next digital sample, the following will be the values consecutively generated between the two samples:

$$S0 + \frac{0*(S1 - S0)}{4} = S0$$

$$S0 + \frac{1*(S1 - S0)}{4}$$

$$S0 + \frac{2*(S1 - S0)}{4}$$

$$S0 + \frac{3*(S1 - S0)}{4}$$

$$S0 + \frac{4*(S1 - S0)}{4} = S1$$

Thus, the interpolated values will match the sample values at each end point and the pseudo-sample values inserted between the sample values will be the result of a linear interpolation.

Figure 7:
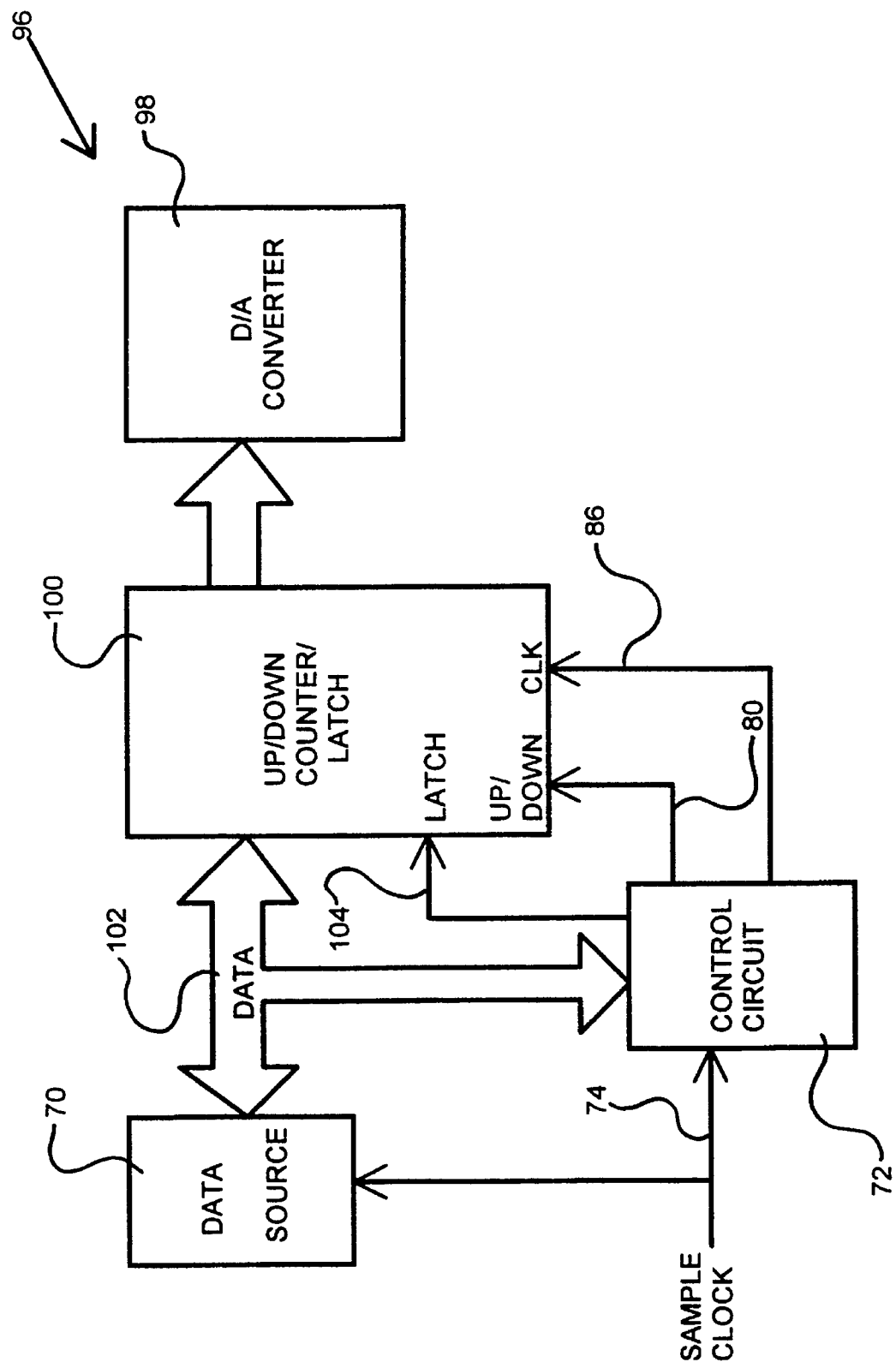
FIG. 7 is a block diagram of a preferred embodiment of the present invention using an up/down counter/latch to accumulate the digital sample and step values and convert the accumulated value with a single D/A converter.

With reference now to FIG. 7, there is shown another preferred embodiment of a D/A converter system 96 employing a single D/A converter 98. In this embodiment, the control circuit 72 fetches a first data sample from the data source 70 and provides said first data sample to an up/down counter/latch 100 in response to each sample clock on signal path 74. In this embodiment, the control circuit 72 generates the reproduction clock on signal path 86, at a rate greater than the sample clock. As previously described, the control circuit 72 increments or decrements the up/down counter/ latch 100 under control of the up/down signal on signal path 80. However, in this embodiment only the single D/A converter 98 is coupled to the output of the up/down counter/latch 100 since the value contained within represents the accumulated sum of each sample value and the interpolated pseudo-sample values. Thus, the resolution of the up/down counter/latch 100 preferably is at least that of the single D/A converter 98. As previously described, the reproduction clock on signal path 86 stops when the value within the up/down counter/latch 100 approaches the second sample value to limit the reproduced analog signal from overshooting or undershooting the value of the original analog signal.

Alteratively, the embodiment of FIG. 7 can operate in an adjustable step mode as previously described in association with FIG. 6D. In this mode, instead of incrementing the up/down counter/latch 100 by a fixed step value, the control circuit 72 can calculate an adjustable step and provide the sum of the digital sample and the interpolated pseudo-samples (the adjustable step) to the up/down counter/latch 100 using a data bus 102 and a latch signal on signal path 104.

Figure 8:
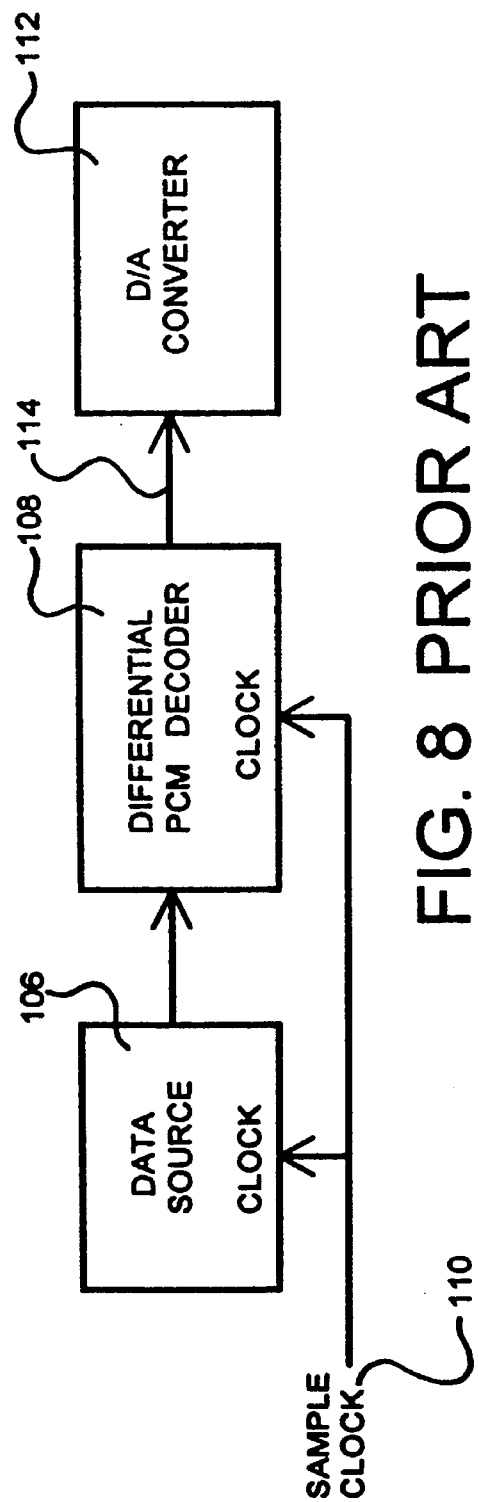
FIG. 8 is a block diagram of a prior art differential PCM D/A converter system.
Figure 9:
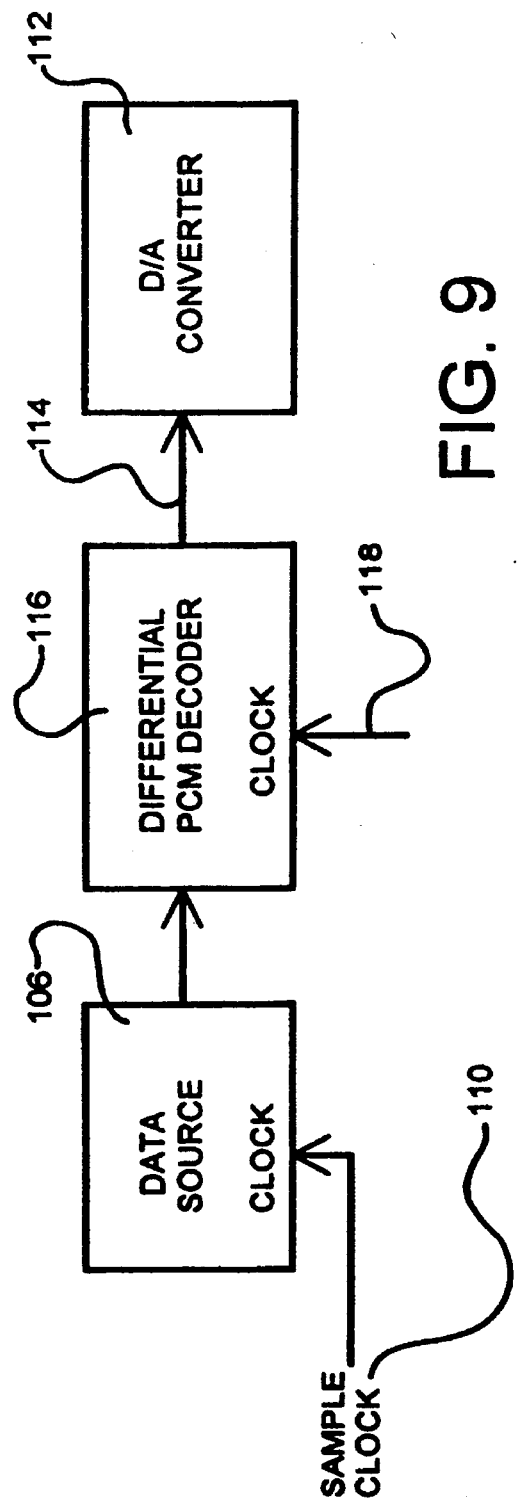
FIG. 9 is a block diagram of a preferred embodiment of the present invention as applied to differential PCM data.

With reference to FIG. 9, there is shown another preferred embodiment, optimizing a prior art differential PCM configuration for use with the present invention. In the prior art of FIG. 8, a data source 106 provides sequential differential digital samples to a differential PCM decoder 108 using a common sample clock 110. The differential PCM decoder 108 takes each differential PCM sample and internally accumulates its value in an accumulator according to rules unique to a particular DPCM encoding technique to generate an accumulated digital value that is coupled to a D/A converter 112 using signal path 114. In the preferred embodiment of FIG. 9, a differential PC decoder 116 is instead driven by a reproduction clock on signal path 118 that is greater than the sample clock on signal path 110. The differential PCM decoder 116 implements the previously described methods of the present invention of alternatively generating fixed or adjustable steps according to the magnitude and sign of the differential PCM signal received at the beginning of each sample period.

The pseudo-sample steps are preferably generated with a higher M-bit binary resolution (each binary bit is representative of a smaller analog signal) than that of the original N-bit digital samples. As an example for the embodiment of FIG. 9, presume an exemplary system with the D/A converter 112 having 8 bits of resolution, i.e., N=8. In this exemplary system, each DPCM sample within the data source 106 contains 3 bits. For this example, the reproduction clock on signal path 118 is increased by a factor of four over the sample clock on signal path 110. If the differential value was only one bit then, without an increase in resolution, a corresponding adjustable step value would be less than one bit in magnitude and thus not reproducible. By increasing the DPCM value to 5 bits of resolution within the differential PCM decoder 116, a factor of 4 increase in resolution is achieved, assuring that all step values can be used. Since these additional 2 bits would represent a finer analog value, the effective digital resolution of the pseudo-samples would be 10 bits, i.e., M=10.

Before adding the accumulated digital step value to the first digital sample it is necessary to digitally scale the values. This preferably is done in one of two ways:

1) the digital step value can be shifted right by two bits, i.e., divided by 4, before the addition, or
2) the digital sample value can be shifted left by two bits, i.e., multiplied by 4, to match the resolution of the digital step value, before the addition.

The first preferred technique allows the use of an 8-bit D/A converter but discards some of the digital resolution achieved by the interpolation process. The second preferred technique maintains the full digital resolution of the present invention, preferably by using a 10-bit D/A converter. Alternatively, an 8-bit D/A converter can be coupled to the 8 most significant bits from the addition.

The previously described embodiments provide linear interpolation between adjacent sampling points. However, it is recognized that the correct signal path between adjacent sample points may actually be a curve, e.g., a concave or convex path. To determine the need for a more complex path, i.e., a curve instead of a straight line, alternative embodiments use P successively produced digital samples, in excess of two, in the neighborhood of the pseudo-samples to better match the curve of the original analog signal.

Additionally, it is recognized that embodiments of the present invention are also useful in generating intermediate digital pseudo-samples that can be stored for subsequent processing. Thus, once the original digital samples are processed, a processed sequence of digital samples, including the digital pseudo-samples can be stored. This processed sequence of digital samples can then be applied to a D/A converter or other apparatus as if it had been originally generated at an increased sampling rate.

Embodiments of the present invention are well-suited for implementation with conventional MSI digital circuitry. Alternatively, in a preferred embodiment the present invention can be implemented on a single integrated circuit used in conjunction with existing reproduction circuitry or may be combined with the existing reproduction circuitry on a single integrated circuit.

Figure 10A:
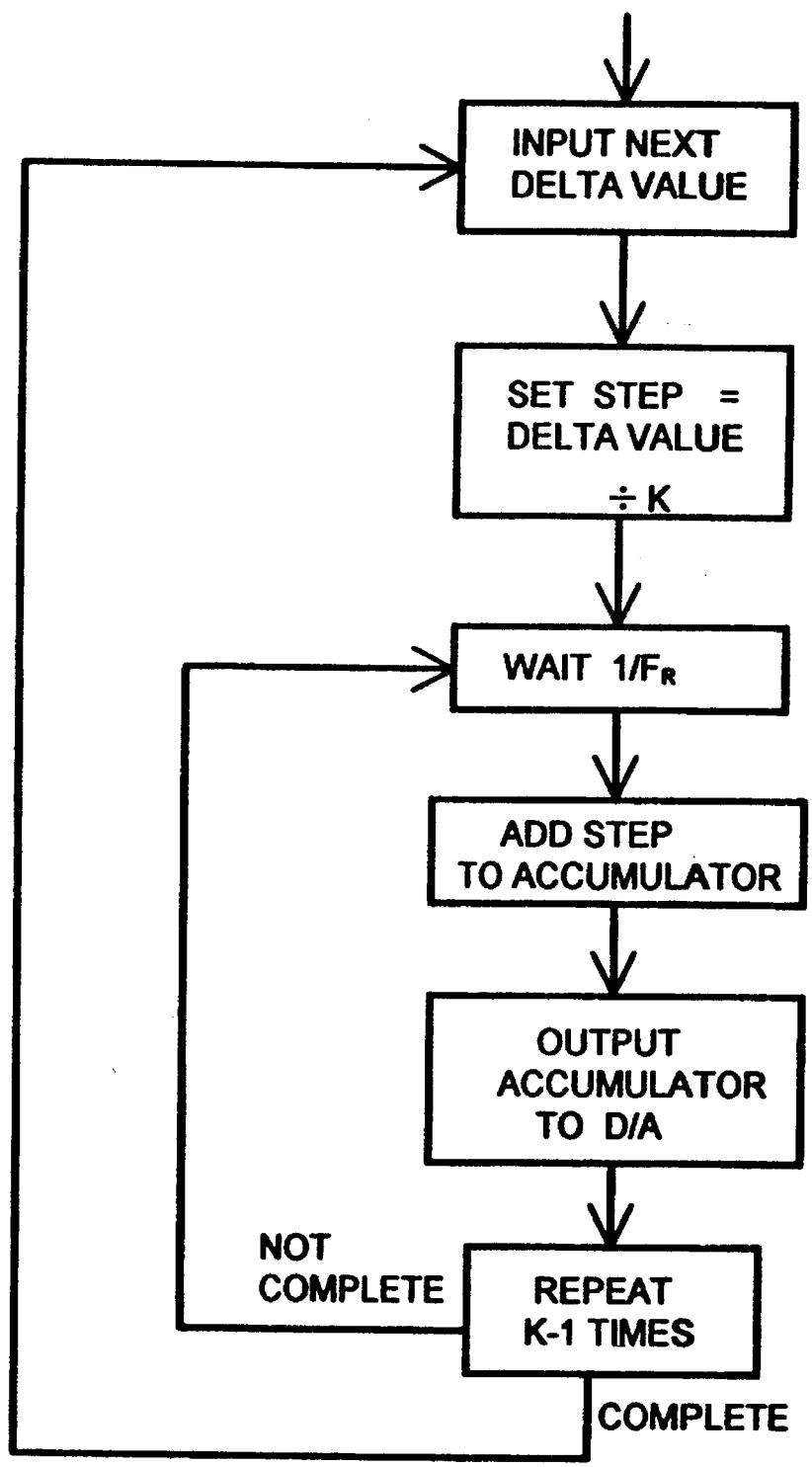
FIG. 10A–B are simplified flow charts showing methods of generating interpolated digital pseudo-values between DPCM digital sample values.
Figure 10B:
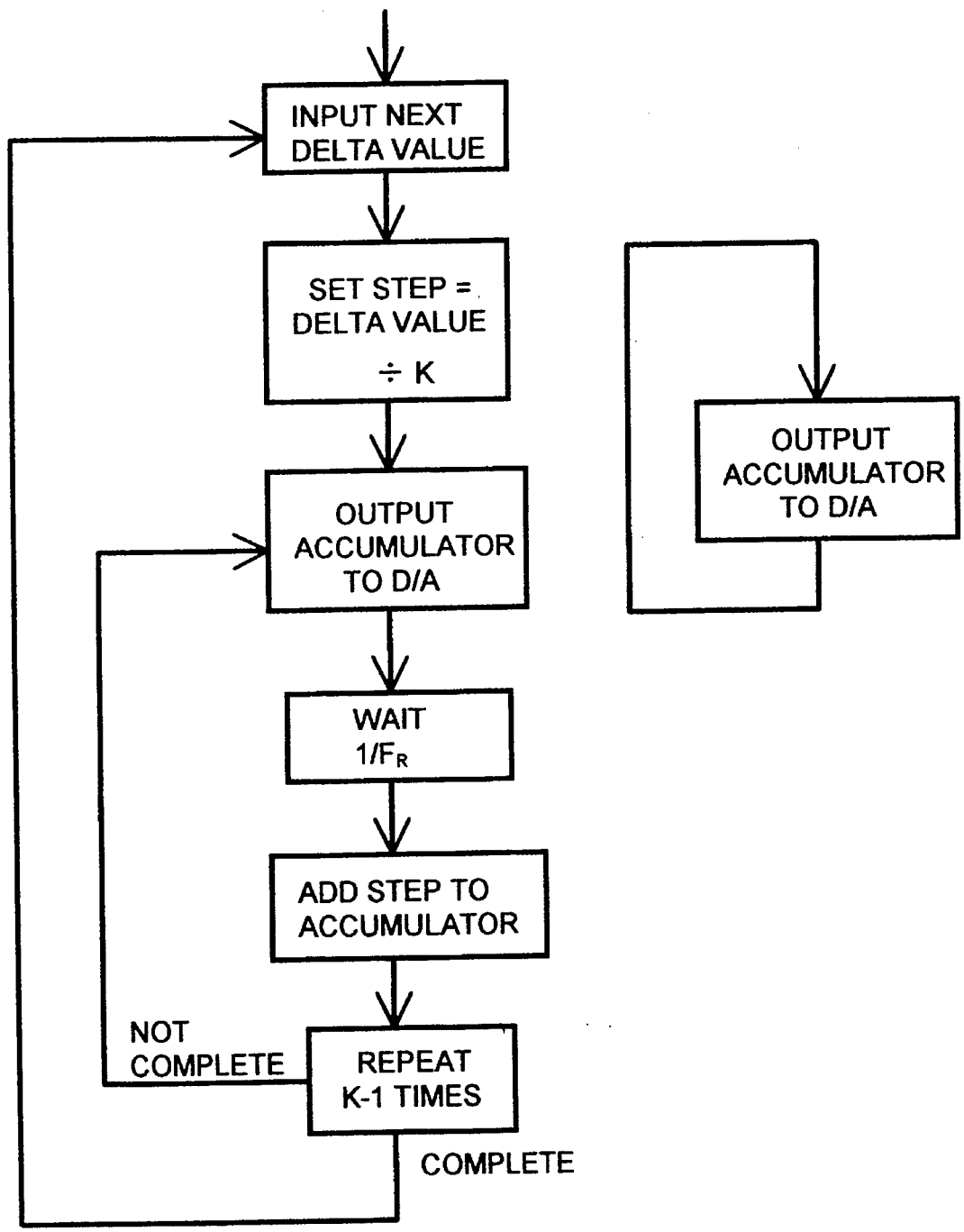

Although a preferred hardware implementation is shown, a software embodiment is also envisioned within the scope of the present invention. With reference to FIG. 10A, a flow chart representing software associated with a DPCM system is shown. In FIG. 10A, the output of the accumulator is periodically supplied to the D/A converter, preferably synchronous to each modification of the accumulator. However, as shown in FIG. 10B, the output of the accumulator can continuously be supplied to the D/A converter in software or hardware. By primarily implementing this method in software, the present invention can be implemented with existing hardware in a typical processing system. Thus, this embodiment will achieve a decrease in noise without an increase in hardware costs.

Although the present invention has been described in detail with reference only to the presently-preferred embodiments, those of ordinary skill in the art will appreciate that various modifications can be made without departing from the invention. Accordingly, the invention is defined by the following claims.

I claim:

1. Apparatus responsive to a first sequence of digital samples where each sample contains N bits, said apparatus comprising:

means for fetching P successively produced digital samples;

interpolation means for generating a plurality of digital pseudo-samples intermediate to each pair of said successively produced digital samples, each pseudo-sample being represented by M bits; and means for interleaving said first digital sample, said generated digital pseudo-samples and said second digital sample to form a second sequence of digital samples.

2. The apparatus of claim 1, wherein P is equal to 2.

3. The apparatus of claim 1, wherein M is equal to N.

4. The apparatus of claim 1, wherein M is greater than N.

5. The apparatus of claim 1, wherein said apparatus is contained within a single integrated circuit.

6. The apparatus of claim 1, wherein said interpolation means comprises generating a series of fixed digital steps between each said pair of successively produced digital samples.

7. The apparatus of claim 1, wherein said sequence of digital samples is derived from a digital decoder/expander.

8. The apparatus of claim 1, additionally comprising:

D/A converter means responsive to an applied multibit digital sample for producing a corresponding analog signal; and means for sequentially applying said second sequence of digital samples to said D/A converter means at a reproduction rate Fr.

9. The apparatus of claim 8, wherein said first sequence of digital samples represents an original analog signal where each sample contains N bits and is derived by sampling said original analog signal at a rate Fs.

10. The apparatus of claim 9, wherein said reproduction rate Fr is greater than Fs.

11. The apparatus of claim 10, wherein said reproduction rate Fr is an integral multiple K of the sampling frequency Fs related by the equation Fr=K * Fs.

12. The apparatus of claim 11, wherein said interpolation means comprises generating a series of K-1 digital steps each step having an adjustable amplitude of essentially 1/K times the difference between each said pair of successively produced digital samples.

13. Apparatus responsive to a sequence of digital difference values corresponding to digital samples representing an original analog signal where each sample contains N bits and is derived by sampling said original analog signal at a rate Fs to produce an analog output signal, said apparatus comprising:

D/A converter means responsive to an applied multibit digital sample for producing a corresponding analog signal;

decoding/expanding means for generating a plurality of expanded digital values representative of said digital samples from said difference values;

accumulator means for storing a first expanded digital value from said decoding/expanding means wherein the contents of said accumulator is coupled to said D/A converter means to transfer said first expanded digital value;

means for providing a first digital difference value representing a difference from said first expanded digital value and a next expanded digital value;

interpolation means for generating a plurality of digital pseudo-samples intermediate to said first expanded digital value and said next expanded digital value, each pseudo-sample being represented by M bits; and means for sequentially accumulating said interpolated digital pseudo-samples in said accumulator at a reproduction rate Fr greater than Fs.

14. The apparatus of claim 13, wherein said reproduction rate Fr is an integral multiple K of the sampling frequency Fs related by the equation Fr=K * Fs.

15. The apparatus of claim 13, wherein the digital resolution of said pseudo-samples is equal to the digital resolution of said digital difference values.

16. The apparatus of claim 13, wherein the digital resolution of said pseudo-samples is greater than the digital resolution of said digital difference values.

17. The apparatus of claim 13, wherein said interpolation means comprises generating a series of fixed digital steps between said first and second expanded digital values.

18. The apparatus of claim 13, wherein said interpolation means comprises generating a series of K-1 digital steps each step having an adjustable amplitude of essentially 1/K times said digital difference value.

19. The apparatus of claim 13, wherein said accumulator means is comprised of an up/down counter.

20. The apparatus of claim 13, wherein said decoding/expanding means corresponds to an adaptive decoding method.

21. The apparatus of claim 13, wherein said apparatus is contained within a single integrated circuit.

22. A method for reproducing an analog signal from a sequence of digital samples of an original analog signal, each sample containing N bits and having been sampled at a rate Fs said reproducing occurring at a reproduction rate Fr where Fr is greater than the sample rate Fs, comprising the steps of:

1) obtaining a first digital sample;

2) setting an accumulator to said first digital sample;

3) waiting a time period equal to 1/Fr;

4) adding a fixed step value to the said accumulator;

5) repeating steps 3–4 while the sum of the contents of said accumulator and said step value is less than a second digital sample and if a time period of 1/Fs has not expired; and 6) repeating steps 1–5 for a next pair of digital samples wherein said second digital sample is the first digital sample for said next pair.

23. The method of claim 22, wherein the contents of said accumulator are periodically supplied to a D/A converter to produce an analog value.

24. The method of claim 22, wherein the contents of said accumulator are continuously supplied to a D/A converter to produce an analog value.

25. The method of claim 22, wherein said accumulator is comprised of an up/down counter.

26. The method of claim 22, wherein said reproduction rate Fr is an integral multiple K of the sampling frequency Fs related by the equation Fr=K * Fs.

27. The method of claim 22, wherein said fixed step size is essentially 1/K times the difference between said second digital sample and said first digital sample.

28. A method for reproducing an analog signal from a sequence of digital samples of an original analog signal, each sample representing a digital delta value between sequential samples and having been sampled at a rate Fs by adding values to an accumulator containing a first accumulated value, said reproducing occurring at a rate of Fr where Fr is greater than Fs, comprising the steps of:

1) obtaining a first difference value;

2) determining a sequence of step values;

3) waiting a time period equal to 1/Fr;

4) adding a step value to said accumulator;

5) repeating steps 3–4 while the sum of the contents of said accumulator and said step value is less than the sum of the first accumulated value and said first difference value;

6) waiting a time period equal to 1/Fr; and 7) repeating steps 1–6 for a next difference value.

29. The method of claim 28, wherein the contents of said accumulator are continuously supplied to a D/A converter to produce an analog value.

30. The method of claim 28, wherein said accumulator is comprised of an up/down counter.

31. The method of claim 28, wherein said reproduction rate Fr is an integral multiple K of the sampling frequency Fs related by the equation Fr=K * Fs.

32. The method of claim 31, wherein step 2 comprises dividing said first difference value by K to generate a sequence of K essentially equal step values.

33. The method of claim 28, wherein said step values have digital resolutions greater than the digital resolutions of said difference values.

34. The method of claim 28, wherein said step values have digital resolutions equal to the digital resolutions of said difference values.

35. Apparatus responsive to a sequence of digital samples representing an original analog signal where each sample contains N bits and is derived by sampling said original analog signal at a rate Fs to reproduce an analog output signal, said apparatus comprising:

a first D/A converter means responsive to an applied multibit digital sample for producing a first analog signal;

first reproduction means to provide said digital samples to said first D/A converter at a rate Fs;

a second D/A converter means responsive to an applied multibit digital sample for producing a second analog signal;

means for fetching P successively produced digital samples;

interpolation means for generating a plurality of digital pseudo-samples intermediate to each pair of said successively produced digital samples, each pseudo-sample being represented by M bits;

means for sequentially applying said generated digital pseudo-samples to said second D/A converter means at a reproduction rate Fr where Fr is greater than Fs; and summing means for summing said first analog signal and said second analog signal to produce a noise-reduced analog signal.

36. The apparatus of claim 35, wherein P is equal to 2.

37. The apparatus of claim 35, wherein said digital samples result from encoding and decoding of the original analog signal.

38. The apparatus of claim 35, wherein said apparatus is contained within a single integrated circuit.

39. The apparatus of claim 35, wherein said reproduction rate Fr is an integral multiple K of the sampling frequency Fs related by the equation Fr=K * Fs.

40. The apparatus of claim 35, wherein M is equal to N.

41. The apparatus of claim 35, wherein M is greater than N.

42. The apparatus of claim 35, wherein said interpolation means comprises generating a series of fixed digital steps between each said pair of successively produced digital samples.

43. The apparatus of claim 35, wherein said interpolation means comprises generating a series of K-1 digital steps each step having an adjustable amplitude of essentially 1/K times the difference between each said pair of successively produced digital samples.

44. A digital to analog converter system, comprising:

data source means for supplying successive digital original samples at a sampling frequency Fs;

an interpolation apparatus responsive to each pair of successive digital original samples for generating at least one digital pseudo-sample;

a digital to analog converter for producing an analog signal; and means for supplying a sequence of original samples and pseudo-samples to said digital to analog converter at a frequency Fr where Fr is an integral multiple K of the sampling frequency Fs related by the equation Fr =K * Fs.

45. The apparatus of claim 1, wherein said interpolation means includes means for shifting to generate each said M-bit pseudo-sample.

46. The apparatus of claim 8, wherein said analog signal contains sampling noise at a frequency exceeding Fr; said apparatus further comprising an audio output device having an output bandwidth less than Fr.

47. The apparatus of claim 8 further comprising an audio output device responsive to said analog signal; and wherein said analog signal contains sampling noise exceeding 20 KHZ.

48. The method of claim 31, wherein step 2 comprises shifting said first difference value to generate a sequence of K essentially equal step values.

49. The system of claim 46, wherein said interpolation apparatus includes means for shifting to generate each said pseudo-sample.

50. The system of claim 44, wherein said analog signal contains sampling noise at a frequency exceeding Fr; said apparatus further comprising an audio output device having an output bandwidth less than Fr.

51. The system of claim 44 further comprising an audio output device responsive to said analog signal; and wherein said analog signal contains sampling noise exceeding 20 KHZ.

* * * * *